United States Patent
Bolouri-Saransar et al.

(10) Patent No.: US 10,126,335 B2
(45) Date of Patent: Nov. 13, 2018

(54) SYSTEM FOR THE VERIFICATION OF THE ABSENCE OF VOLTAGE

(71) Applicant: Panduit Corp., Tinley Park, IL (US)

(72) Inventors: Masud Bolouri-Saransar, Orland Park, IL (US); James E. Fabiszak, Darien, IL (US); Richard A. Rago, New Lenox, IL (US)

(73) Assignee: Panduit Corp., Tinley Park, IL (US)

( * ) Notice: Subject to any disclaimer, the term of this patent is extended or adjusted under 35 U.S.C. 154(b) by 0 days.

(21) Appl. No.: 15/512,182

(22) PCT Filed: Sep. 22, 2015

(86) PCT No.: PCT/US2015/051344
§ 371 (c)(1),
(2) Date: Mar. 17, 2017

(87) PCT Pub. No.: WO2016/048954
PCT Pub. Date: Mar. 31, 2016

(65) Prior Publication Data
US 2017/0269129 A1    Sep. 21, 2017

Related U.S. Application Data

(60) Provisional application No. 62/053,420, filed on Sep. 22, 2014.

(51) Int. Cl.
*G01R 31/06* (2006.01)
*G01R 19/155* (2006.01)
(Continued)

(52) U.S. Cl.
CPC ........... *G01R 19/155* (2013.01); *G01R 15/12* (2013.01); *G01R 31/2829* (2013.01); *G01R 31/026* (2013.01)

(58) Field of Classification Search
None
See application file for complete search history.

(56) References Cited

U.S. PATENT DOCUMENTS 3,141,128 A    7/1964  Behr
3,496,453 A *  2/1970  Swain ............... G01R 19/16514
                                            219/497

(Continued)

FOREIGN PATENT DOCUMENTS

DE    10140855 A1    3/2003
FR    2597210 A1    10/1987
(Continued)

*Primary Examiner* — Patrick Assouad
*Assistant Examiner* — Demetrius Pretlow
(74) *Attorney, Agent, or Firm* — Christopher S. Clancy; James H. Williams; Christopher K. Marlow

(57) ABSTRACT

A system for the verification of the absence of voltage includes a first impedance, an amplitude limiter electrically connected to the first impedance, a second impedance electrically connected to the first impedance and the amplitude limiter, a varactor circuit electrically connected to the second impedance, an isolation capacitor electrically connected to the second impedance and varactor circuit, an envelope circuit with a voltage detection circuit connected to the isolation circuit via a buffer, and an RF oscillator. The amplitude limiter configured to limit the voltage applied to the varactor circuit. The RF oscillator configured to interact with the varactor circuit in order to create a modulated circuit for the buffer and envelope circuit. The envelope circuit is configured to demodulate the signal for the voltage detection circuit.

4 Claims, 5 Drawing Sheets

(51) Int. Cl.
*G01R 15/12* (2006.01)
*G01R 31/28* (2006.01)
*G01R 31/02* (2006.01)

(56) References Cited

U.S. PATENT DOCUMENTS

| | | | |
|---|---|---|---|
| 3,536,997 A * | 10/1970 | Holt | G01R 17/105 |
| | | | 324/706 |
| 3,737,765 A | 6/1973 | Lee et al. | |
| 3,810,003 A | 5/1974 | Portoulas | |
| 3,863,208 A | 1/1975 | Balban | |
| 3,914,757 A * | 10/1975 | Finlay, Jr. | H02J 13/0089 |
| | | | 340/870.02 |
| 4,193,026 A * | 3/1980 | Finger | G01R 19/16542 |
| | | | 324/428 |
| 4,489,278 A * | 12/1984 | Sawazaki | H04R 19/04 |
| | | | 324/113 |
| 4,870,343 A | 9/1989 | Dooley et al. | |
| 5,245,275 A | 9/1993 | Germer et al. | |
| 5,285,163 A | 2/1994 | Liotta | |
| 5,353,014 A | 10/1994 | Carroll et al. | |
| 5,600,524 A | 2/1997 | Neiger et al. | |
| 5,715,125 A | 2/1998 | Neiger et al. | |
| 5,814,997 A | 9/1998 | Bouchez | |
| 5,867,019 A | 2/1999 | Malenko et al. | |
| 5,874,895 A | 2/1999 | Devamey | |
| 5,986,557 A | 11/1999 | Clarke | |
| 6,075,448 A | 6/2000 | Verkhovskiy | |
| 6,100,679 A | 8/2000 | McCasland | |
| 6,111,733 A | 8/2000 | Neiger et al. | |
| 6,157,184 A | 12/2000 | Atherton | |
| 6,313,642 B1 | 11/2001 | Brooks | |
| 6,703,938 B1 | 3/2004 | Clarke | |
| 6,988,061 B2 | 1/2006 | Gray et al. | |
| 7,154,281 B2 | 12/2006 | Piesinger | |
| 7,268,558 B2 | 9/2007 | Mills et al. | |
| 7,319,315 B2 | 1/2008 | Martin | |
| 2007/0108992 A1 * | 5/2007 | Yanagisawa | G01R 19/20 |
| | | | 324/658 |

FOREIGN PATENT DOCUMENTS

| | | |
|---|---|---|
| JP | H02214892 A | 8/1990 |
| JP | H0651001 A | 2/1994 |
| JP | H0977409 U | 10/1994 |

* cited by examiner

SYSTEM FOR THE VERIFICATION OF THE ABSENCE OF VOLTAGE

FIELD OF THE INVENTION

This invention relates generally to voltage detection systems and more specifically to voltage detection systems using amplitude modulation techniques.

BACKGROUND OF THE INVENTION

Prior to performing work on electrical installation/equipment, workers are required to verify that the equipment is in an electrically safe state. Until proven otherwise, one must assume that the equipment is energized and take all necessary precautions, including utilizing appropriate personal protective equipment (PPE). One part of the verification of an electrically safe work condition involves a test for the absence of voltage. This test is performed by a trained and qualified electrician using an adequately rated voltage tester, usually a portable voltmeter or multi-meter. The electrician first tests his meter on a known, energized source to ensure it is working properly. He/she then verifies that voltage is absent in the electrical equipment by metering phase-to-phase and phase-to-ground. Finally, he re-tests his meter on a known, energized source to ensure it is still functioning properly and wasn't damaged during the test. Although voltage verification is an NFPA 70E requirement and considered a best practice, the test itself still presents a hazard because workers are exposed to energized circuits and conductors when using the voltage tester during the live portions of the test.

A permanent installed device that is able to detect the presence and verify the absence of primary (single- or multi-phase AC or DC) voltage and positively indicate the status of voltage in a particular electrical compartment would be useful for this type of application.

One of the key steps to verifying the absence of a signal is to perform a check to verify that the device/tester can detect a known voltage unit (test the tester). One other step is to verifying the unit is actually measuring the signal and has not unknowingly been disconnected (connectivity test).

SUMMARY OF THE INVENTION

A system for the verification of the absence of voltage includes a first impedance, an amplitude limiter electrically connected to the first impedance, a second impedance electrically connected to the first impedance and the amplitude limiter, a varactor circuit electrically connected to the second impedance, an isolation capacitor electrically connected to the second impedance and varactor circuit, an envelope circuit with a voltage detection circuit connected to the isolation circuit via a buffer, and an RF oscillator. The amplitude limiter configured to limit the voltage applied to the varactor circuit. The RF oscillator configured to interact with the varactor circuit in order to create a modulated circuit for the buffer and envelope circuit. The envelope circuit is configured to demodulate the signal for the voltage detection circuit.

DETAILED DESCRIPTION OF THE PREFERRED EMBODIMENTS

Figure 1:
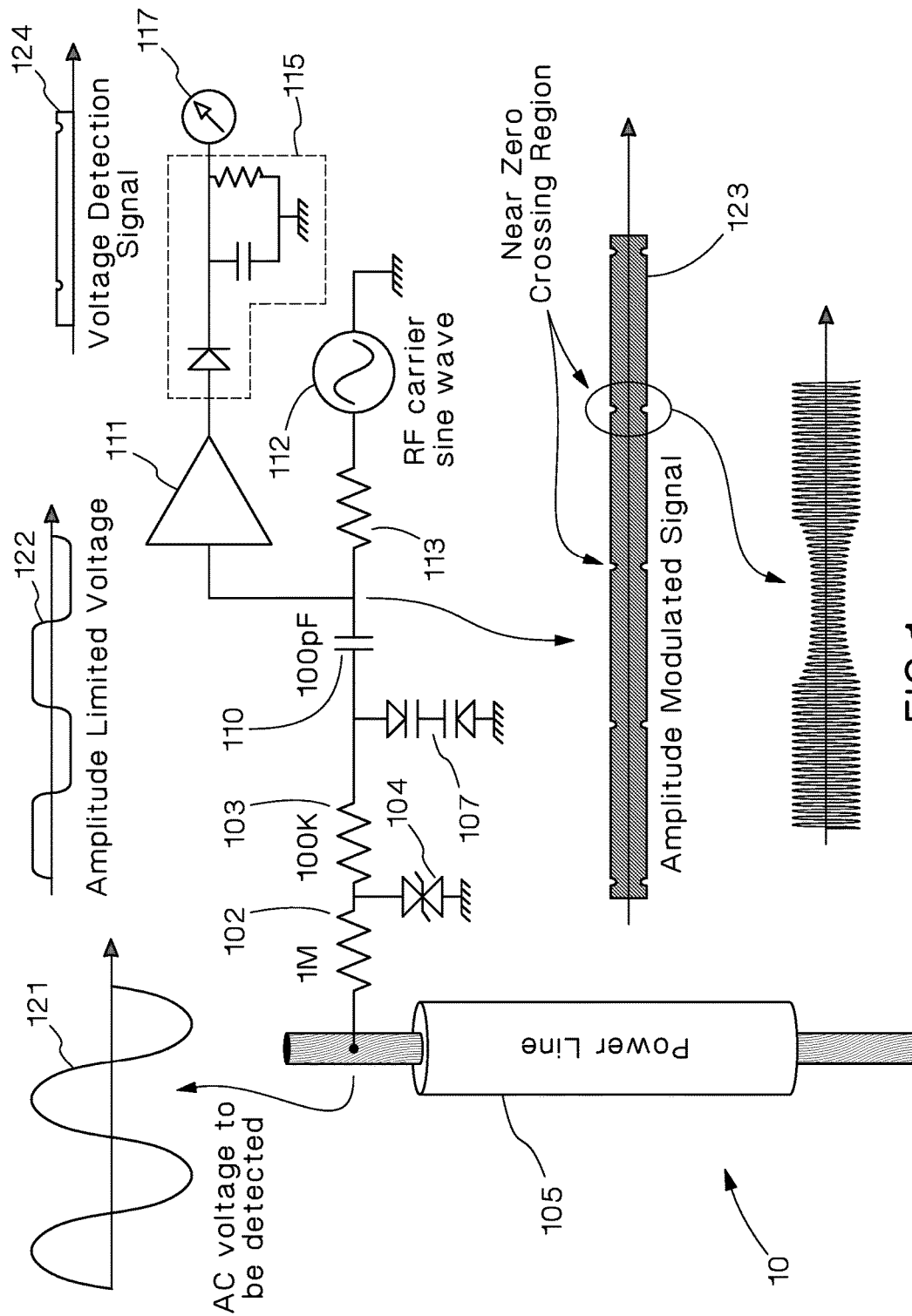
FIG. 1 is a schematic view of a system for the verification of the absence of voltage.

FIG. 1 shows one embodiment of a system 10 for the verification of the absence of voltage. The system 10 includes a power line 101 (in this application, the power line is the voltage source that is to be detected by the system 10), amplitude limiter 104, varactor circuit 107, isolation capacitor 110, RF oscillator circuit 112, and an envelope detection circuit 115.

The amplitude limiter 104 limits the amplitude of the signal that will be applied to the varactor circuit 107.

The varactor circuit 107 includes two opposing varactor diodes 108. Varactor diodes act as voltage controlled capacitors whose capacitance increases as the reverse voltage applied across the varactor diode decreases. As a result, as the reverse voltage decreases so does the impendence path for the RF oscillator circuit 112. Thus, since the resistor of the oscillator 113 circuit remains constant (and since a voltage divider is created between the resistor 113 and varactor circuit 107), a modulated signal is created for the envelope detection circuit 115 which reflects the voltage applied across the varactor circuit 107.

The envelope detection circuit 115 acts as a demodulator with an output that is dependent upon the detected voltage of the system 10. By monitoring the output voltage of the envelope detection circuit 115, and by knowing a base or calibration magnitude, one can then determine whether voltage is present from the power signal.

The isolation capacitor 110 isolates the RF oscillator circuit 112 and the envelope detection circuit 115 from low frequency and DC signals from the amplitude limiter 104 and varactor circuit 107.

FIG. 1 shows how a power signal 121 will be modified at various points in the system 10. FIG. 1 shows the unmodified sine wave representing the power signal 121. The amplitude limiting circuit 104 then limits the peak voltage of the power signal, creating an amplitude limited voltage 122. An amplitude modulated signal 123 is created from the RF oscillating circuit 112 and the varactor circuit 107. The amplitude modulated circuit 123 is then changed to a voltage detection signal 124 by the envelope detection circuit 105.

Figure 2:
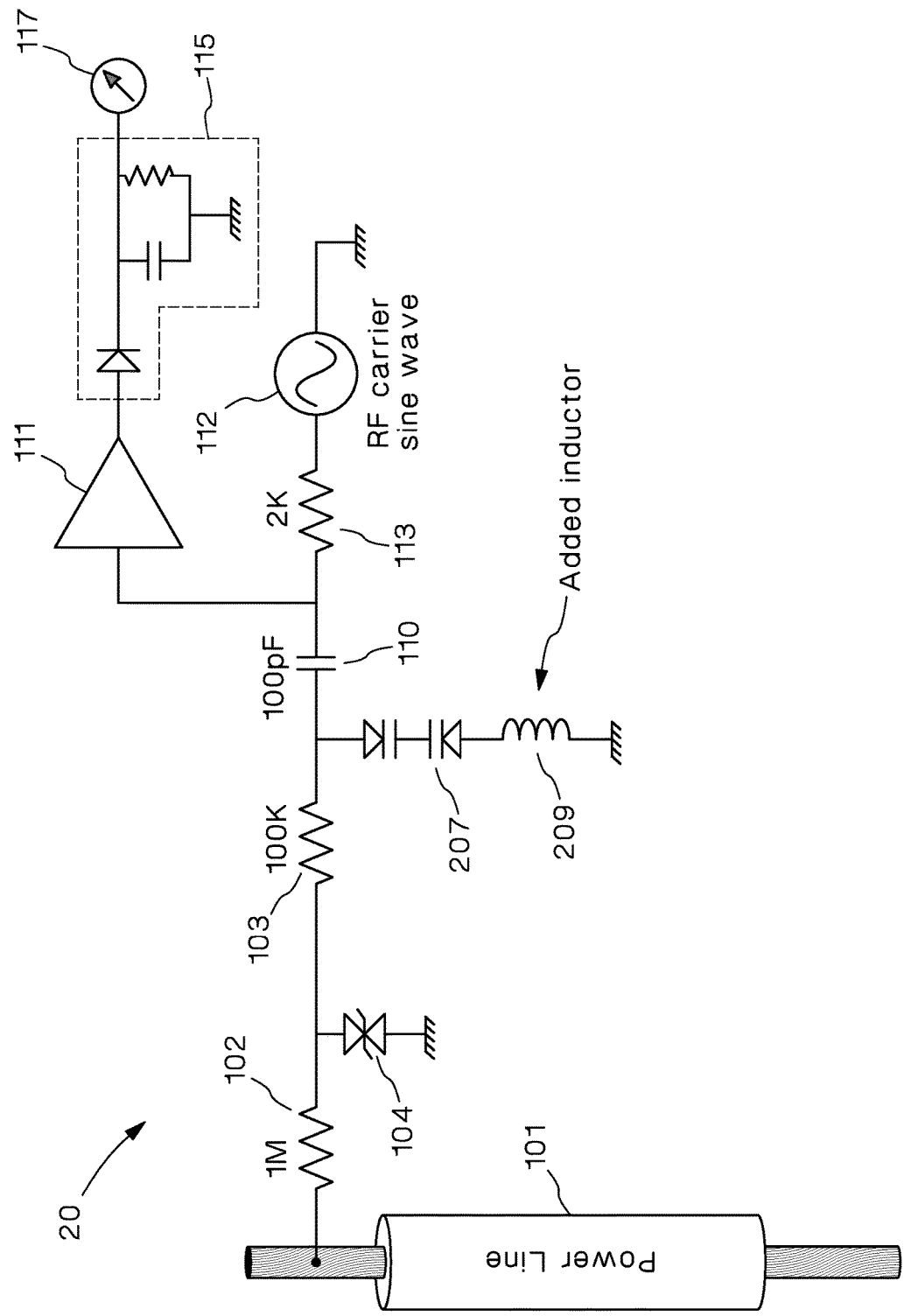
FIG. 2 is a schematic view of a system for the verification of the absence of voltage which is similar to the system of FIG. 1, but adds an inductor in series with the varactor diodes.

The sensitivity of such a system can be optimized around a specific voltage level (such as zero volts) as shown in FIG. 2. FIG. 2 shows a system 20 for the verification of the absence of voltage similar to the system 10 of FIG. 1, but with an added inductor 208 in the varactor circuit 207. The added inductor 208 creates a resonance circuit which acts as a short circuit at the resonance frequency. In one embodiment, the resonance frequency is the same frequency as the signal generated by the RF oscillating circuit 112. The sensitivity of the system 20 can be further optimized by adjusting the Q factor of the LCR circuit created by the RF oscillating circuit 112 and the varactor circuit 207 (with added inductor).

Figure 3:
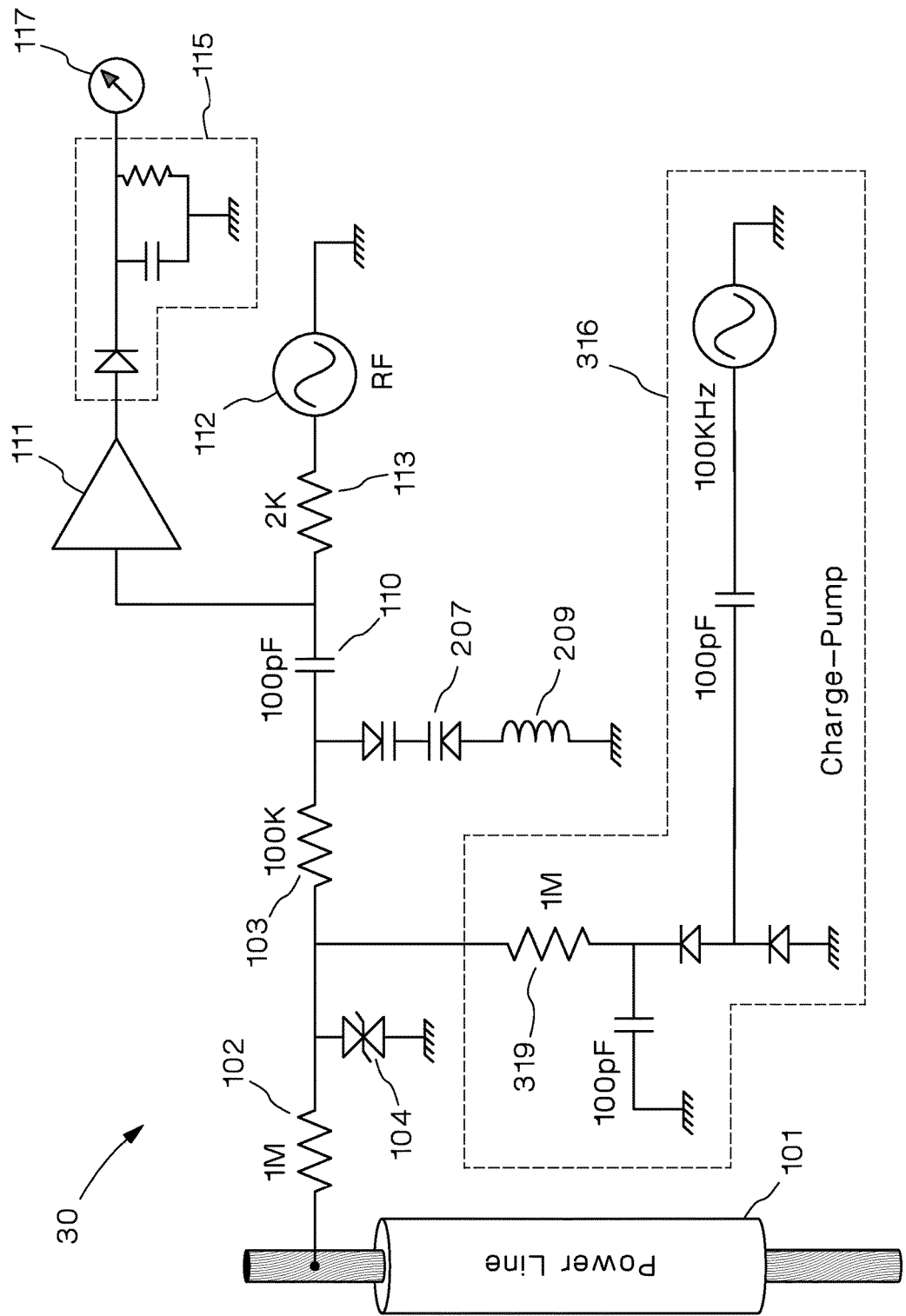
FIG. 3 is a schematic view of a system for the verification of the absence of voltage which is similar to the system of FIG. 2, but adds a charge-pump circuit.

Absence of voltage indicators may need to perform various tests to help indicate that the device is functioning properly. These tests may be performed automatically or manually (initiated by a user). FIG. 3 shows a system 30 for the verification of the absence of voltage which adds a charge-pump circuit 316 to the system of FIG. 2. The charge-pump circuit 316 can present a voltage similar to a voltage the system 30 is intended to detect. Detection of a voltage from the charge-pump circuit 316 will help to establish that the system is operating as intended.

Figure 4:
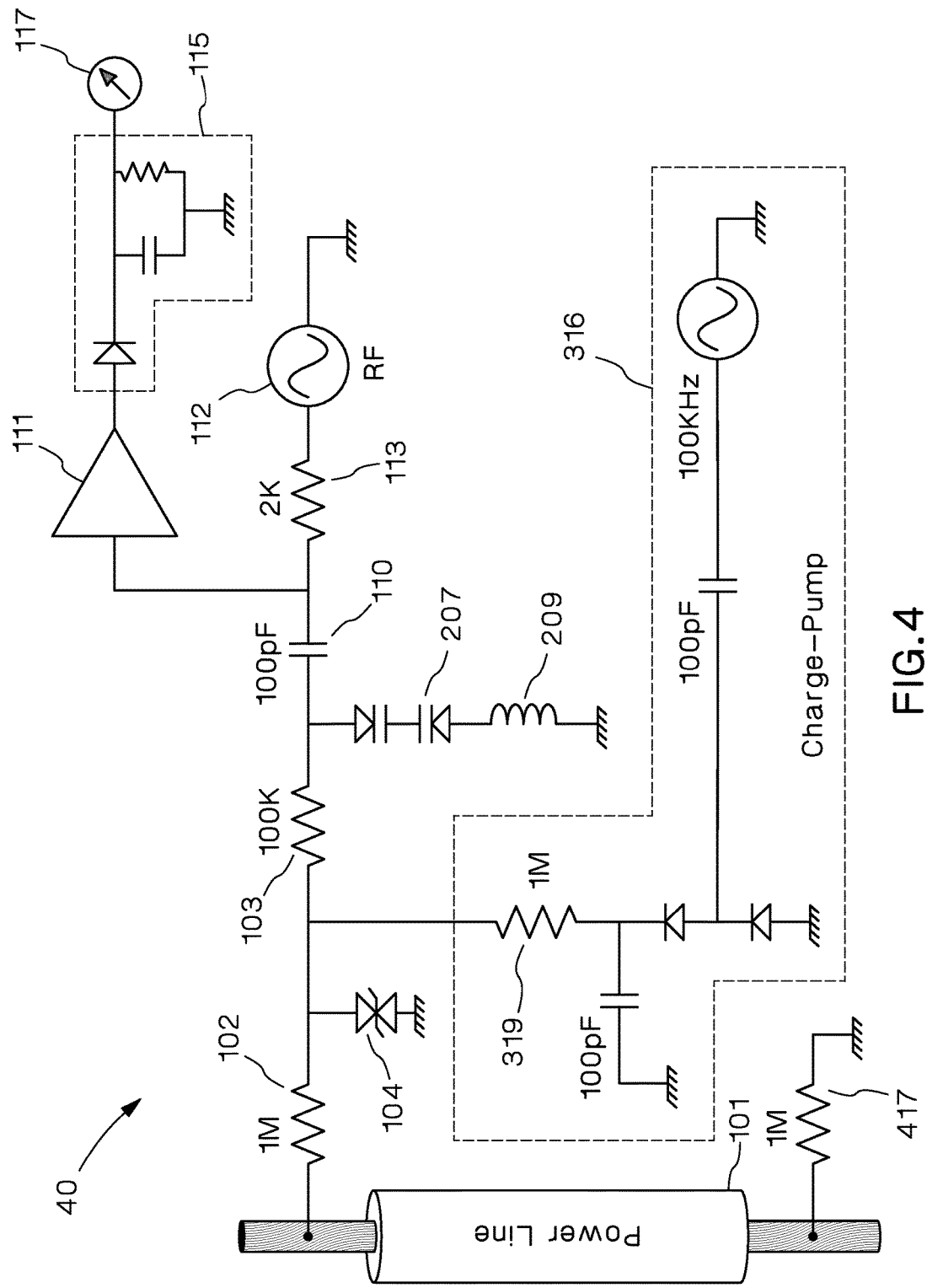
FIG. 4 is a schematic view of a system for the verification of the absence of voltage which is similar to the system of FIG. 3, but adds an additional high impedance path to ground from the power line.

Another test can involve testing for continuity between the power line 101 and the rest of the system. FIG. 4 shows a system 40 for the verification of the absence of voltage similar to the system 30 of FIG. 3, except it adds an independent high impedance path to ground 417 from the power line 101. The addition of the independent high impedance path 417 will act as a voltage divider to the charge pump circuit 316. If the voltage detected from the charge pump circuit 316 is not divided, then it can be determined that the remainder of the system 40 is not connected to the power line 101.

Figure 5:
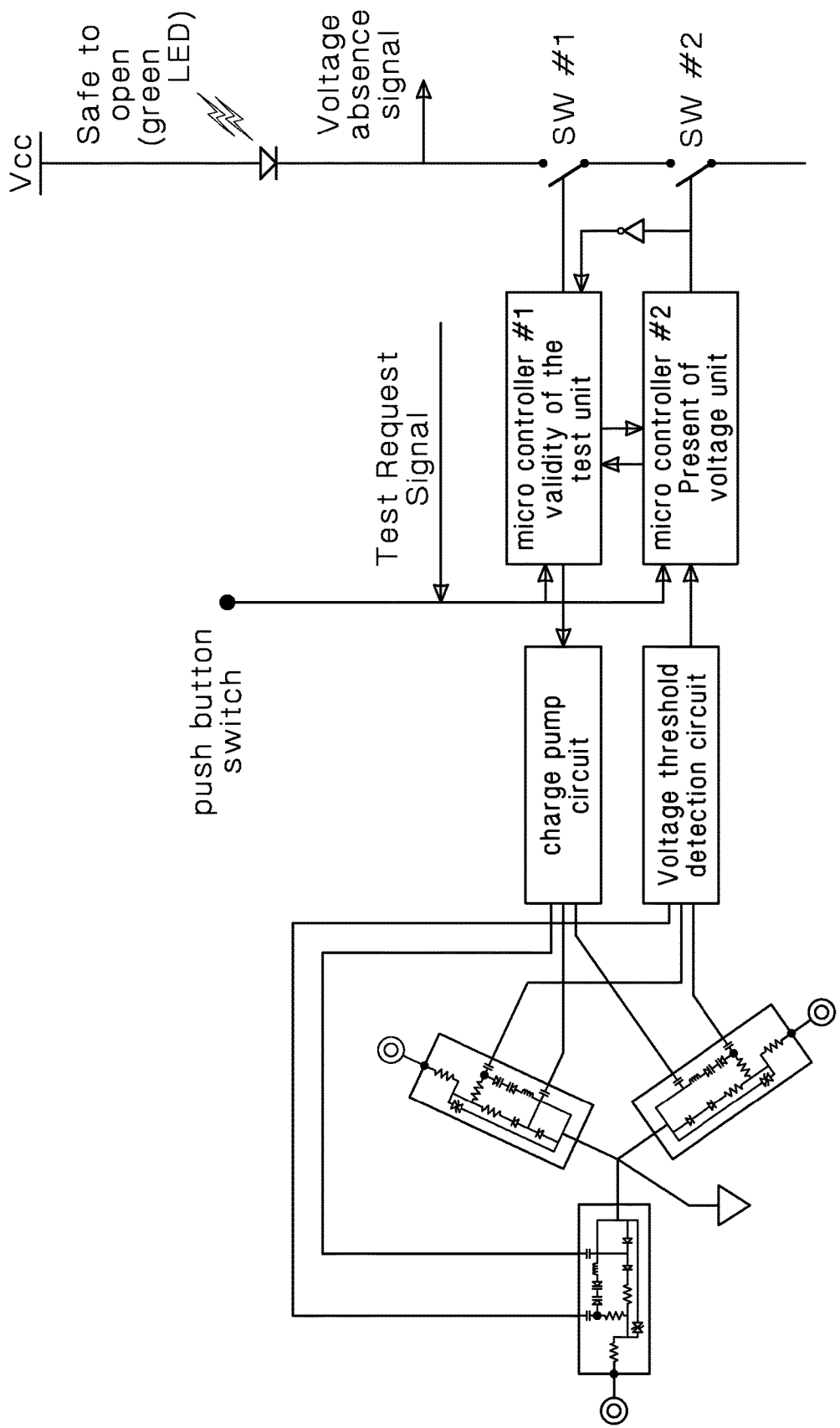
FIG. 5 shows how the above systems can be applied to a three-phase power line.

The above systems can be applied with a three phase power line as shown in FIG. 5. A separate power source can be used to operate the system in order to positively indicate the absence of voltage. The positive indication of the absence of voltage can be indicated on a display or as an output signal. In one embodiment, the system can be activated using a test or push button or through a test request signal sent to the system (FIG. 5 shows an embodiment which utilizes a push button). After the system is activated, it can run through a series of tests such as testing the operation through a charge pump circuit and testing for continuity.

In order to meet some fault tolerant requirements and to provide a high degree of confidence in function of the devise, the functions of the system can be split into two independent branch circuits. One is to perform voltage detection function and the other one is for testing the system functionality by presenting various states and monitoring that the voltage-detection branch circuits are functioning as intended. The various states can include a connectivity test on each phase, voltage testability of the device on each phase, and other self-test functions While particular embodiments and applications of the present invention have been illustrated and described, it is to be understood that the invention is not limited to the precise construction and compositions disclosed herein and that various modifications, changes, and variations may be apparent from the foregoing without departing from the spirit and scope of the invention as described.

The invention claimed is:

1. A system for the verification of the absence of voltage comprising:
   a first impedance connected to a power source;
   an amplitude limiter electrically connected to the first impedance;
   a second impedance electrically connected to the first impedance and the amplitude limiter;
   a varactor circuit electrically connected to the second impedance;
   an isolation capacitor electrically connected to the second impedance and the varactor circuit;
   an RF oscillator electrically connected to the isolation capacitor;
   an envelope detection circuit electrically connected to the RF circuit and the isolation capacitor; and
   a voltage detection circuit connected to the envelope circuit, wherein the amplitude limiter is configured to limit the voltage applied across the varactor circuit, the RF oscillator is configured to interact with the varactor circuit to create a modulated signal for the envelope circuit, and wherein the envelope circuit is configured to demodulate the signal for the voltage detector wherein the envelope circuit is electrically connected to the RF oscillator and the isolation capacitor via a buffer.

2. The system of claim 1 wherein the varactor circuit includes an inductor configured to create a resonance circuit.

3. The system of claim 2 further comprising a charge pump circuit configured to create a voltage similar to one intended to be detected by the system.

4. The system of claim 3 further comprising an independent high impedance path to ground for the charge pump circuit configured to create a voltage divider to the charge pump circuit.

* * * * *